United States Patent
Granata et al.

(10) Patent No.: US 9,123,859 B2
(45) Date of Patent: Sep. 1, 2015

(54) MODULE-LEVEL PROCESSING OF SILICON PHOTOVOLTAIC CELLS

(71) Applicants: IMEC VZW, Leuven (BE); Katholieke Universiteit Leuven, KU LEUVEN R&D, Leuven (BE)

(72) Inventors: Stefano Granata, Leuven (BE); Twan Bearda, Mechelen (BE)

(73) Assignees: IMEC VZW, Leuven (BE); Katholieke Universiteit Leuven, KU Leuven R&D, Leuven (BE)

(*) Notice: Subject to any disclaimer, the term of this patent is extended or adjusted under 35 U.S.C. 154(b) by 0 days.

(21) Appl. No.: 14/479,695

(22) Filed: Sep. 8, 2014

(65) Prior Publication Data

US 2015/0111335 A1    Apr. 23, 2015

(30) Foreign Application Priority Data

Oct. 21, 2013  (EP) .................................... 13189576

(51) Int. Cl.
*H01L 21/00* (2006.01)
*H01L 31/18* (2006.01)
*H01L 31/0392* (2006.01)
*H01L 31/048* (2014.01)

(52) U.S. Cl.
CPC ........ *H01L 31/1876* (2013.01); *H01L 31/0392* (2013.01); *H01L 31/048* (2013.01)

(58) Field of Classification Search
None
See application file for complete search history.

(56) References Cited

U.S. PATENT DOCUMENTS

2009/0117680 A1*  5/2009  Yamazaki et al. .............. 438/57

OTHER PUBLICATIONS

Steckenreiter, Verena et al., "Qualification of Encapsulation Materials for Module-Level-Processing", Solar Energy Materials & Solar Cells, vol. 120, 2014, pp. 396-401.
Govaerts, Jonathan et al., "Development of a-Si:H/c-Si Heterojunctions for the i2-Module Concept: Low-Temperature Passivation and Emitter Formation on Wafers Bonded to Glass", Solar Energy Materials & Solar Cells, vol. 113, 2013, pp. 52-60.

* cited by examiner

*Primary Examiner* — Kyoung Lee
(74) *Attorney, Agent, or Firm* — McDonnell Boehnen Hulbert & Berghoff LLP

(57) ABSTRACT

A method for module-level processing of photovoltaic cells is provided. The method includes: bonding at least one crystalline silicon photovoltaic substrate to a carrier by means of an adhesive layer, thereby leaving part of the adhesive layer uncovered; after bonding, exposing the uncovered part of the adhesive layer and the at least one crystalline silicon photovoltaic substrate to a plasma; and removing a surface portion of the at least one crystalline photovoltaic substrate. The method may further include performing an annealing step of the adhesive before bonding the at least one photovoltaic substrate to the carrier, and performing an outgassing step of the adhesive after bonding the at least one photovoltaic substrate to the carrier. The method may further include module-level rear side processing of the at least one crystalline silicon photovoltaic substrate to make a photovoltaic module.

15 Claims, 2 Drawing Sheets

MODULE-LEVEL PROCESSING OF SILICON PHOTOVOLTAIC CELLS

CROSS-REFERENCE TO RELATED APPLICATIONS

This application claims priority to EP 13189576.5, filed Oct. 21, 2013, which is incorporated by reference in its entirety.

FIELD

The present disclosure relates to methods for module-level processing of silicon photovoltaic cells.

BACKGROUND

A significant part of the cost of a crystalline silicon photovoltaic module may be attributed to the cost of the silicon substrates used. Therefore, working with thinner substrates may lead to a cost reduction of the module. For thinner substrates (e.g. for substrates with a thickness of less than 180 micrometer, e.g. down to 5 micrometer) there is a need for suitable fabrication processes, because thin substrates are more susceptible to breakage and warpage as compared to thicker cells. Both breakage and warpage can substantially impact the yield of a production process and therefore the cost of photovoltaic cells and modules.

Methods have been proposed for fabricating photovoltaic modules comprising thin back-contact photovoltaic cells, wherein after front side processing the partially processed substrates are bonded to an optically transparent carrier (superstrate) by means of an adhesive, and the rear side processing is done afterwards (module-level processing). In such methods the rear side cell processing is done while the substrates are bonded on a supporting structure, thus reducing the risk of breakage and warpage.

After bonding of the substrates to the carrier, rear side processing of the substrates is done. Because of the presence of a carrier (superstrate, e.g. glass) and an adhesive, there are a number of restrictions for the rear side process steps, for example related to the process temperature and the use of certain chemicals.

Process temperatures for the module-level rear side processing are typically limited to 200° C. or less. This means that widely adopted schemes for surface passivation, emitter formation and/or Back Surface Field (BSF) formation for high-efficiency cells cannot be used. A low-temperature alternative is the a-Si:H/c-Si heterojunction cell, wherein the emitter and a BSF may be formed by PECVD deposition of a doped amorphous silicon layer. A thin high-quality intrinsic a-Si:H layer (passivation layer) may be provided in between the doped a-Si:H layer and the crystalline silicon substrate, for improved passivation of interface defects.

Silicone-based adhesives are typically used to bond the substrates to the carrier. The adhesive is preferably applied on the carrier over an area larger than the area of silicon substrates, i.e. extending outside the edges of the silicon substrates, to enable homogenous and stable bonding.

In the areas not covered by the substrates the adhesive is directly exposed to the plasma during the intrinsic a-Si:H passivation layer PECVD deposition. This results in a degradation of the passivation quality. This degradation may be caused by outgassing of silicone molecules of low molecular weight and/or etching of silicone molecules during amorphous silicon deposition, and/or it may result from an interaction between volatile compounds escaping from the adhesive with precursors used in the amorphous silicon deposition process.

As reported by V. Steckenreiter et al. in "Qualification of encapsulation materials for module-level-processing", Solar Energy Materials and Solar Cells 120 (2014), 396-401, the quality of the amorphous silicon surface passivation may be improved by outgassing the silicone adhesive in the absence of a plasma immediately prior to the amorphous silicon deposition. The effect of such pre-outgassing treatment depends on the type of adhesive used. It is a disadvantage of this approach that it only works in certain cases depending on the silicone composition. The pre-outgassing treatment is done in the reactor used for a-Si:H deposition, just before a-Si:H deposition. Performing the pre-outgassing in the same reactor as the a-Si deposition may lead to contamination of the chamber.

SUMMARY

The present disclosure aims to provide methods for module-level processing of photovoltaic cells, the method comprising rear side processing of crystalline photovoltaic substrates bonded to a carrier or superstrate by means of an adhesive, wherein the stability of the adhesive during rear side processing is improved.

The present disclosure aims to provide methods for module-level processing of photovoltaic cells, the method comprising rear side surface passivation of crystalline photovoltaic substrates bonded to a carrier or superstrate by means of an adhesive, wherein a good rear side surface passivation quality is obtained for a broad range of adhesive compositions.

The present disclosure is related to a method for module-level processing of photovoltaic cells, the method comprising: bonding at least one crystalline silicon photovoltaic substrate to a carrier by means of an adhesive layer, thereby leaving part of the adhesive layer uncovered; after bonding, exposing the uncovered part of the adhesive layer and the at least one crystalline silicon photovoltaic substrate to a plasma; and removing a surface portion of the at least one crystalline photovoltaic substrate.

In embodiments of the present disclosure, exposing the uncovered part of the adhesive layer and the at least one crystalline silicon photovoltaic substrate to a plasma may for example comprise exposing to an oxygen containing plasma or an argon containing plasma, the present disclosure not being limited thereto. The exposure to the plasma comprises exposure to ions, e.g. resulting from field-induced acceleration of ions from the bulk of the plasma towards the exposed surfaces of the adhesive layer and the at least one crystalline silicon photovoltaic substrate ('ion bombardment').

In preferred embodiments a plurality of crystalline silicon photovoltaic substrates is bonded to the carrier, so as to make a photovoltaic module with a plurality of electrically connected photovoltaic cells. In preferred embodiments the carrier and the adhesive layer are optically transparent in a wavelength range of the solar spectrum that may be absorbed by the photovoltaic substrate (i.e. within the absorption spectrum of the photovoltaic substrate). The adhesive layer may for example be a silicone layer, the present disclosure not being limited thereto. In preferred embodiments the at least one photovoltaic substrate is oriented with a front side facing the transparent carrier. The carrier may have the function of a superstrate in a photovoltaic module. Bonding the at least one crystalline silicon photovoltaic substrate to the carrier may comprise covering the carrier with an adhesive layer and positioning the at least one photovoltaic substrate on the adhesive layer. At this stage of the process, the adhesive layer may for example be a viscous liquid or a gel, the present disclosure not being limited thereto.

Before positioning the at least one photovoltaic substrate on the adhesive layer, an annealing step may be done to at least partially cure the adhesive layer. The annealing step may for example comprise heating to a temperature in the range between 100° C. and 150° C. for 5 to 15 minutes.

After positioning the at least one photovoltaic substrate on the adhesive layer, an outgassing step may be done to remove cyclics and air bubbles from the adhesive layer. The outgassing step may for example comprise heating to a temperature in the range between 150° C. and 200° C. for 15 to 60 minutes.

Removing a surface portion of the at least one crystalline photovoltaic substrate may comprise chemically etching a 1 micrometer to 5 micrometer thick, for example 1 micrometer to 3 micrometer thick, surface portion of the at least one crystalline photovoltaic substrate. This etching step may remove damage caused by exposure to the plasma. Chemically etching the surface portion of the at least one crystalline photovoltaic substrate may for example comprise etching in a solution of TMAH (tetramethylammonium hydroxide) in water. Preferably a TMAH concentration between 1% and 5% is used, the present disclosure not being limited thereto. The etching may for example be done at a temperature in the range between 20° C. and 50° C., the present disclosure not being limited thereto. Other etchants may be used, such as for example another suitable alkaline solution such as a KOH solution or a NaOH solution, the present disclosure not being limited thereto.

The method may further comprise rear side processing of the at least one photovoltaic substrate to make a photovoltaic cell and a photovoltaic module. Rear side processing may comprise depositing an intrinsic a-Si:H passivation layer on the at least one photovoltaic substrate, for example by PECVD. Rear side processing may further comprise for example emitter formation, Back Surface Field formation, contact formation, the present disclosure not being limited thereto.

It is an advantage of a method according to the present disclosure that a good surface passivation quality may be obtained at the rear side of the photovoltaic cells, for a broad range of compositions of the adhesive layer. In embodiments of the present disclosure the outgassing step is preferably done outside the reactor used for depositing the surface passivation layer. It is an advantage of this approach that contamination of the reactor may be avoided.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

Figure 1:
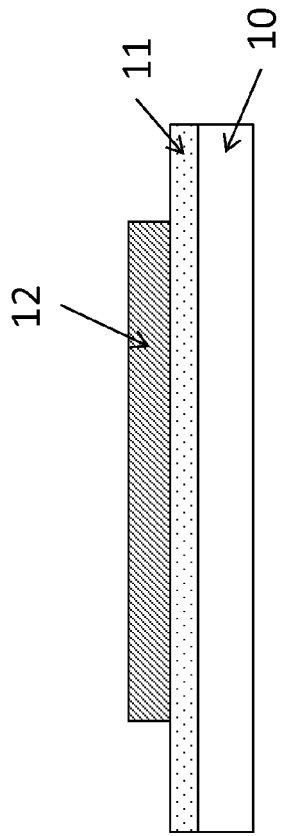
FIG. 1 illustrates process steps of a method according to the present disclosure.

Any reference signs in the claims shall not be construed as limiting the scope of the present disclosure.

In the different drawings, the same reference signs refer to the same or analogous elements.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, the front surface or front side of a photovoltaic cell or of a photovoltaic module or of a substrate is the surface or side adapted for being oriented towards a light source and thus for receiving illumination. The back surface, rear surface, back side or rear side of a photovoltaic cell or a photovoltaic module or a substrate is the surface or side opposite to the front surface or side.

In the context of the present disclosure, "photovoltaic substrate" is used for indicating a substrate on which front side processing for forming a photovoltaic cell has already been performed, and on which rear side processing for forming a photovoltaic cell is not yet finished. Front side processing refers to all process steps that are performed at the front side of the substrate in a process for forming a photovoltaic cell. Rear side processing refers to all process steps that are performed at the rear side of the substrate in a process for forming a photovoltaic cell.

In the context of the present disclosure, a superstrate is a transparent protective cover at the front side of a photovoltaic module, protecting the photovoltaic cells of the module against environmental impact and being highly transparent in a wavelength range of the solar spectrum corresponding to the absorption spectrum of the photovoltaic cells.

A method according to the present disclosure comprises: bonding at least one crystalline silicon photovoltaic substrate to a carrier by means of an adhesive layer, thereby leaving part of the adhesive layer uncovered; after bonding, exposing the uncovered part of the adhesive layer and the at least one crystalline silicon photovoltaic substrate to a plasma; and removing a surface portion of the at least one crystalline photovoltaic substrate.

In embodiments of the present disclosure, exposing the uncovered part of the adhesive layer and the at least one crystalline silicon photovoltaic substrate to a plasma may for example comprise exposing to an oxygen containing plasma or an argon containing plasma, the present disclosure not being limited thereto.

The exposure to the plasma comprises exposure to ions ('ion bombardment', i.e. exposure to ions that are accelerated from the bulk of the plasma). The exposure to the plasma may further comprise exposure to vacuum UV light, i.e. UV light that is generated in the plasma as a by-product of dissociation of ions and radicals.

In preferred embodiments the carrier and the adhesive are optically transparent and the at least one photovoltaic substrate is oriented with a front side facing the transparent carrier. After bonding of the at least one crystalline substrate to the carrier, part of the adhesive layer is covered by a photovoltaic substrate and another part of the adhesive layer is not covered by a photovoltaic substrate (uncovered part of the adhesive layer).

It was found that exposing the uncovered part of the adhesive layer to a plasma results in a surface modification of the exposed adhesive layer, i.e. a modification of the material properties in a surface portion of the adhesive layer. It was found that an upper part of the adhesive layer is oxidized and transformed into a silica-like layer, a bottom part of the adhesive layer remains unaffected, and an intermediate part is transformed into a layer with an increased density. The thickness of these different parts depends for example on the material of the adhesive layer and on the plasma parameters. There may be a gradual transition between the different parts of the adhesive layer after plasma treatment.

The oxidized, upper part or upper layer of the adhesive layer may be removed during the step of removing the surface portion of the at least one crystalline photovoltaic substrate.

It was surprisingly found that this surface modification improves the stability of the adhesive layer during subsequent plasma treatments, such as for example PECVD deposition of an intrinsic a-Si:H passivation layer. It was found that the intermediate, densified part (densified layer) of the adhesive layer provides a good protection against degradation of the adhesive layer under plasma exposure, which may e.g. be related to process steps performed during rear side processing of the photovoltaic substrates. The presence of the densified layer allows preventing degradation of the surface passivation quality, e.g. of an amorphous silicon rear side passivation layer.

Besides the uncovered part of the adhesive layer, also the rear side of the at least one photovoltaic substrate is exposed to the plasma. This causes damage in a surface portion of the at least one photovoltaic substrate. In a method of the present disclosure this damage is removed by removing a surface portion of the photovoltaic substrate, for example by means of a silicon etching solution, such as for example a TMAH containing solution, or any other suitable alkaline solution such as a KOH solution or a NaOH solution, the present disclosure not being limited thereto.

Figure 2:
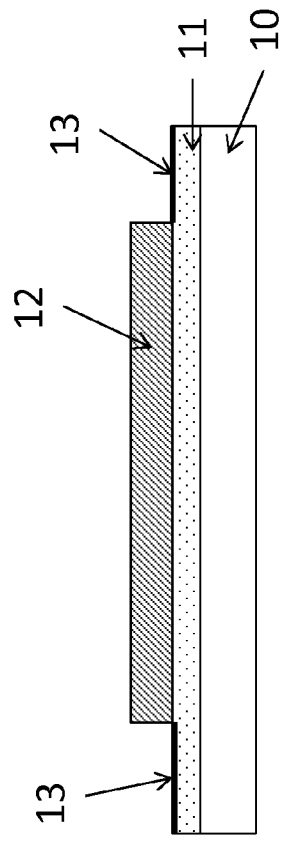
FIG. 2 illustrates process steps of a method according to the present disclosure.
Figure 3:
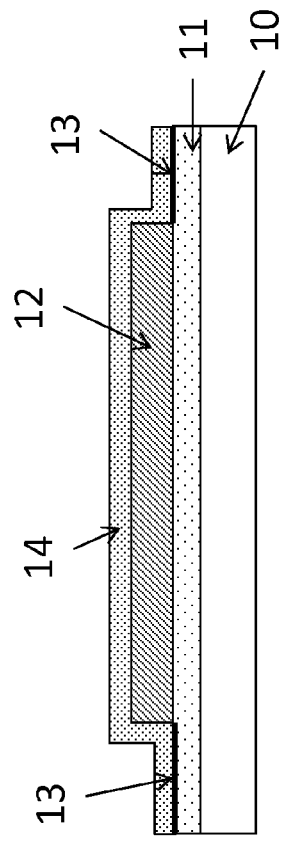
FIG. 3 illustrates process steps of a method according to the present disclosure.

FIG. 1 to FIG. 3 illustrate process steps of a fabrication process according to the present disclosure.

As shown in FIG. 1, a silicon photovoltaic substrate 12 is (or a plurality of silicon photovoltaic substrates are) bonded to (attached to) an optically transparent carrier (superstrate) 10 such as a glass plate by means of an adhesive layer 11, e.g. a silicone adhesive layer, with the front side of the photovoltaic substrate 12 oriented towards the superstrate 10. The silicon photovoltaic substrate is a crystalline silicon substrate on which the front side photovoltaic processing has been done. For example, before attaching the substrate 12 to the superstrate 10, the substrate may be cleaned, the front surface may be textured and/or passivated (for example with an amorphous silicon layer or with any other suitable passivation layer known by a person skilled in the art) and/or a front surface field may be formed and/or an antireflection coating may be deposited on the front surface.

Attaching the substrates 12 to the superstrate 10 may for example comprise providing an adhesive layer 11 on the superstrate 10, followed by an annealing step. The annealing step may for example be done at a temperature in the range between 100° C. and 150° C. for 5 to 15 minutes in vacuum. This annealing step results in (partial) curing of the adhesive: it leads to an increased viscosity of the adhesive layer. After the annealing step the photovoltaic substrates 12 are bonded to the superstrate 10. Next an outgassing step (for example 15 to 60 minutes at a temperature in the range between 150° C. and 200° C. in vacuum) is done, to outgass cyclics and to remove air bubbles trapped in the adhesive layer. After attachment of the substrates to the superstrate, the adhesive is not fully covered by the substrates: around the edges of the substrates and in between substrates the adhesive is still uncovered, and thus exposed to the environment.

Providing the adhesive layer 11 on the superstrate 10 may be done by any suitable method known to a person skilled in the art, such as for example screen printing, dispensing, blade coating, spin coating, spray coating, dip coating, or by lamination, the present disclosure not being limited thereto.

As shown in FIG. 2, after bonding of the photovoltaic substrates 12 to the superstrate 10, a treatment in a plasma, e.g. a RIE (Reactive Ion Etching) plasma treatment, is done, thereby exposing the uncovered parts of the adhesive layer and the rear side of the photovoltaic substrates to the plasma. This plasma treatment results in a modification of the material properties in a surface portion of the silicone adhesive layer at locations 13 where it is exposed, i.e. at locations where it is not covered by a photovoltaic substrate is present. An upper part of the adhesive layer is oxidized and transformed into a silica-like layer, a bottom part of the adhesive layer remains unaffected, and an intermediate part is transformed into a layer with an increased density.

Suitable process parameters for this plasma treatment may be determined experimentally and may depend on the equipment used and on the type of plasma used. In experiments done in the context of the present disclosure, it was found that the treatment may be done at ambient temperature, preferably with a duration of the plasma exposure of at least 10 seconds in case of an Ar plasma and at least 1 minute in case of an $O_2$ plasma, a power higher than 300 mW/cm$^2$ and a pressure lower than 500 mTorr, the present disclosure not being limited thereto.

The RIE oxygen plasma treatment may result in surface damage at the rear side (exposed side) of the photovoltaic substrates and may create defects in a surface portion, e.g. a 1 micrometer to 3 micrometer thick surface portion, of the photovoltaic substrates. This damage is removed in a subsequent silicon etching step. For example, a cleaning/etching sequence of HF:HCl:H$_2$O 1:1:20, TMAH:H$_2$O 2:100 and HF:HCl:H2O 1:1:20 may be done. This cleaning/etching process removes contamination and surface damage from the rear side of the photovoltaic substrates. It was experimentally found that for etching temperatures higher than 50° C. and TMAH concentrations higher than 5%, lifetime degradation at the substrate borders occurs. This lifetime degradation may be related to damage caused to the silicone adhesive by the TMAH (etching of the adhesive layer by TMAH). This damage increases with increasing temperature and with increasing TMAH concentration, and it may also depend on the characteristics of the adhesive used. Therefore, when using TMAH, the etching process is preferably done at a temperature between 20° C. and 50° C., for example between 30° C. and 45° C. The TMAH concentration is preferably between 1% and 5%, for example 2%. However, the present disclosure is not limited thereto. For example, for lower temperatures higher TMAH concentrations may be used (for example 25% TMAH at 20° C.) and for lower TMAH concentrations higher temperatures may be used (for example 60° C. for 1% TMAH). Other suitable silicon etchants may be used.

The cleaning/etching step may also remove the silica-like upper portion of the adhesive layer, formed as a result of the plasma treatment. Therefore, after this cleaning and etching step the adhesive layer consists of a bottom part that is not affected by the plasma treatment and a surface portion (corresponding to the intermediate layer described above) having an increased density. This surface portion with increased density is further also referred to as an 'inert layer'.

As shown in FIG. 3, after the cleaning/etching step, rear side processing of the photovoltaic module may be done. Rear side processing may for example comprise depositing an intrinsic amorphous silicon (i-a-Si:H) passivation layer 14 by PECVD. Preferably the amorphous silicon layer is deposited at a temperature lower than 200° C., for example at a temperature in the range between 150° C. and 200° C., for example at 160° C. After intrinsic a-Si:H layer deposition an annealing step under an inert atmosphere may be done to improve the quality of this layer. Preferably this a-Si:H annealing step is done at a temperature lower than 300° C.

It was experimentally found that a process sequence according to the present disclosure, including a treatment of the exposed adhesive with a plasma, results in a modification of the (silicone) adhesive surface. As described above, after the cleaning and etching step the adhesive layer comprises a surface portion with an increased density ('inert layer'). It was found that this layer with increased density prevents outgassing of the adhesive during subsequent amorphous silicon deposition, and prevents direct interaction of the plasma with the silicone adhesive layer. It was found that this process allows obtaining a good amorphous silicon surface passivation layer that is not contaminated with elements from the silicone adhesive layer.

Experiments were done wherein a silicon substrate was bonded to a glass superstrate by means of a screen printed silicone adhesive. An n-type mono-crystalline float zone silicon substrate with a resistivity of 200 Ohm cm was used, with the front side passivated by an i/n+ amorphous silicon layer. Before bonding the substrate to the superstrate, the adhesive was annealed at 100° C. for 15 minutes in vacuum (150 mTorr). After bonding, an outgassing step was done in vacuum at 200° C. for 1 hour, followed by slow cooling down. Next a RIE oxygen plasma treatment was done at ambient temperature for 5 minutes, 200 W, 100 mTorr. This was followed by a cleaning and etching sequence: 1 minute HF:HCl 2%, 6 minutes TMAH 2% at 45° C. and 2 minutes HF:HCl 2%. A 30 nm thick PECVD intrinsic amorphous silicon passivation layer was then deposited at 160° C., followed by a 1 hour annealing step.

Figure 4:
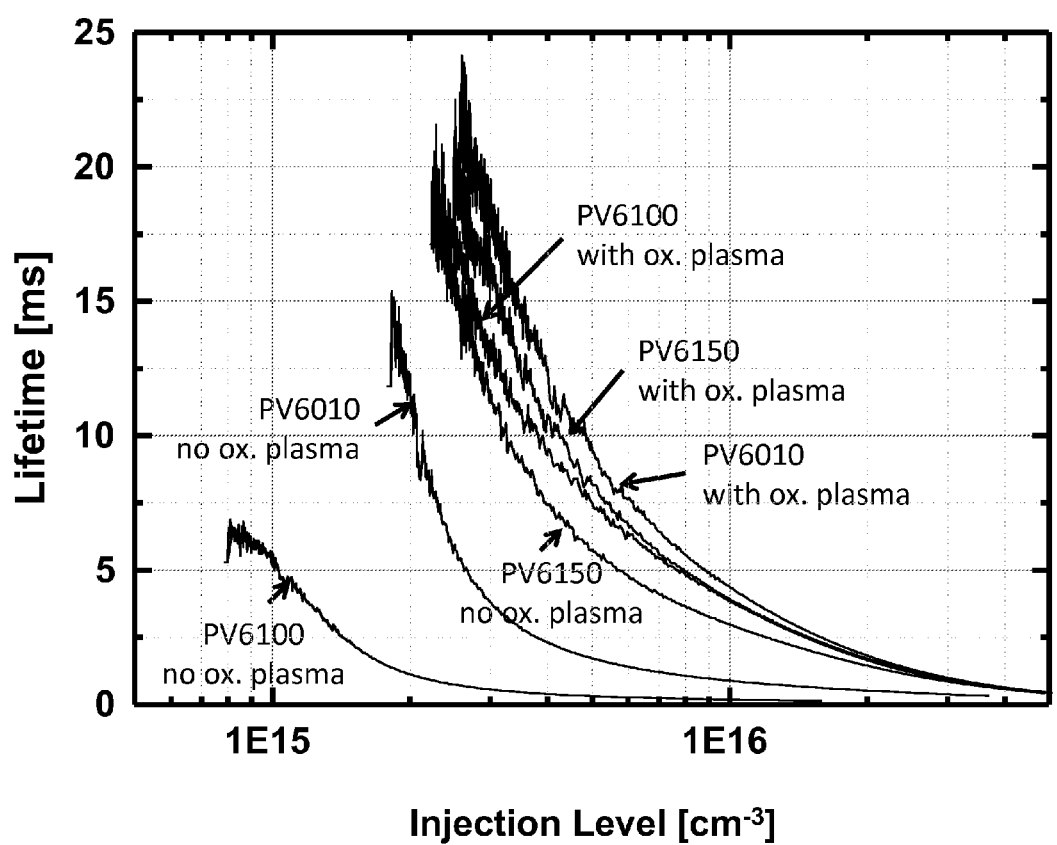
FIG. 4 shows the results of lifetime measurements on crystalline silicon substrates bonded to a superstrate by means of a silicone adhesive, for samples with and without oxygen plasma treatment before the deposition of an amorphous silicon passivation layer, and for different types of adhesives.

FIG. 4 shows results of QSSPC (Quasi Steady State Photo Conductance) lifetime measurements for such bonded wafers with and without oxygen plasma treatment before deposition of the amorphous silicon passivation layer, for different types of silicone adhesive: Dow Corning PV-6010, PV-6100 and PV-6150. From the results it can be concluded that a good lifetime (and thus a good surface passivation) is obtained for the different types of adhesive when using a method according to the present disclosure.

Further experiments were done to investigate which elements contribute to the surface modification of the adhesive layer and the formation of an inert layer. When using an oxygen containing RIE plasma as described above, the plasma results in the presence of oxygen radicals, VUV (vacuum ultra-violet) light emission and ion bombardment. The presence of oxygen radicals may lead to chemical oxidation of a surface of the adhesive layer; VUV light emission may result in polymerization and photo-oxidation; and the ion bombardment may result in surface densification and physical oxidation.

The modifications induced to the silicone adhesive layer by exposure to the plasma may result from (a combination of) these three phenomena. In order to understand the contribution of each of these mechanisms to the formation of the inert layer, dedicated experiments were done.

Experiments were done to investigate the influence of the O$_2$ radicals on the modifications induced in the silicone adhesive layer, by comparing samples treated with an O$_2$ plasma and samples treated with an Ar plasma under similar experimental conditions.

The samples used in the experiments comprise silicon wafers bonded to a glass superstrate according to a method of the present disclosure. N-type, 5 cm×5 cm FZ silicon wafers were used with a thickness of 200 micrometer and a resistivity of 2 Ohm-cm. The wafers were bonded to a 700 micrometer thick quartz superstrate having an area of 12.5 cm×12.5 cm. Before attaching the wafers to the quartz superstrate, the samples were cleaned in a H$_2$SO$_4$/H$_2$O$_2$ mixture and in a HF/HCl mixture, and an amorphous silicon a-Si:H(i/n) passivation layer was deposited at the front side. After bonding to the superstrate an outgassing step was done at 200° C. for 60 minutes. Next, part of the samples was exposed to an oxygen plasma and another part was exposed to an argon plasma. The process conditions for used for both plasmas are: power density of 636 mW/cm$^2$, pressure of 100 mTorr, gas flow of 100 sccm. The duration of the plasma exposure was different for different samples, varying between 10 seconds and 5 minutes (10 seconds, 30 seconds, 1 minute, 3 minutes and 5 minutes). Next the samples were cleaned in HF-TMAH-HF sequences, and finally a rear side a-Si:H(i) passivation layer was deposited by PECVD. The quality of the rear side surface passivation layer was evaluated by QSSPC and Photoluminescence measurements for the different samples.

The minority carrier effective lifetime $\tau_{eff}$ was recorded by QSSPC as a function of injection level. The measurements were done in a central part of the wafers, in an area of approximately 4 cm×4 cm. For all samples, regardless of the type of plasma and the duration of the plasma treatment, good effective lifetime values were measured, with insignificant differences between the different samples.

Photoluminescence measurements revealed differences in uniformity between the different samples. The samples treated with an Ar plasma show uniform $\tau_{\it eff}$ values across the full 5 cm×5 cm sample surface, independent of the duration of the plasma treatment. For samples treated with an $O_2$ plasma also uniform $T_{\it eff}$ values were obtained across the full 5 cm×5 cm sample surface, except for the samples treated during a very short time (10 seconds and 30 seconds) in the oxygen plasma. For these samples, the effective lifetime was lower near the edges of the wafer as compared to the center of the wafer. This edge portion with reduced effective lifetime disappears progressively for longer oxygen plasma treatment times.

The results of these experiments show that, similarly to an $O_2$ plasma, an Ar plasma leads to strong oxidation of the silicone adhesive layer and to the formation of an inert layer useful for preventing interaction of a plasma with the adhesive layer in a subsequent process step, e.g. enabling a good module-level a-Si:H passivation. However, the different time dependency for both plasmas suggests differences in the modifications induced to the silicone adhesive layer by the $O_2$ and Ar plasmas respectively. These differences become important at short treatment times: while a 30 seconds or even a 10 seconds treatment with an Ar plasma is sufficient to form an inert layer, a longer duration of the plasma treatment is needed for the $O_2$ plasma.

From these experiments it may be concluded that the presence of $O_2$ radicals during the plasma exposure is not required for the formation of the inert layer. Therefore the formation of an inert layer may be mainly related to ion bombardment and/or UV light exposure.

Further experiments were done to investigate the influence of the ion bombardment on the modifications induced in the silicone adhesive layer, by comparing samples treated with an Ar plasma (as described above) and samples treated with an UV lamp in an Ar atmosphere.

An UV lamp was used that emits two wavelengths (185 nm and 254 nm) with a power of 28 mW/cm². Different samples (prepared as described above) were exposed to the UV light at atmospheric pressure, instead of exposure to a plasma. Different exposure times were used: 5 minutes, 10 minutes, 20 minutes and 40 minutes. After exposure to the UV light, the samples were cleaned in a HF-TMAH-HF sequence, and finally a rear side a-Si:H(i) passivation layer was deposited by PECVD. The quality of the surface passivation was evaluated by QSSPC and Photoluminescence for the different samples.

It was found that the effective lifetimes measured for these UV-light-treated samples are lower as compared to a sample treated in an Ar plasma for 10 seconds, but higher than for samples without any treatment. At the edges of the samples a lower effective lifetime was measured as compared to the effective lifetime in the center of the wafers. From these experiments it may be concluded that exposure to UV light alone is not sufficient to form an inert layer that can sufficiently prevent silicone-plasma interactions.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology without departing from the disclosure.

The invention claimed is:

1. A method for module-level processing of photovoltaic cells, the method comprising:
   (a) bonding at least one crystalline silicon photovoltaic substrate to a carrier by means of an adhesive layer, wherein the adhesive layer is present on a surface of the carrier, wherein part of the adhesive layer remains uncovered after the bonding, and wherein the at least one crystalline silicon photovoltaic substrate has a front side and a rear side; and
   (b) exposing the uncovered part of the adhesive layer and the at least one crystalline silicon photovoltaic substrate to a plasma; and
   (c) removing a surface portion of the at least one crystalline photovoltaic substrate.

2. The method according to claim 1, wherein exposing the uncovered part of the adhesive layer and the at least one crystalline silicon photovoltaic substrate to a plasma comprises exposure to an ion bombardment.

3. The method according to claim 1, wherein the at least one crystalline silicon photovoltaic substrate is oriented with its front side facing the carrier.

4. The method according to claim 1, wherein bonding the at least one crystalline silicon photovoltaic substrate to the carrier comprises covering the carrier with an adhesive layer and positioning the at least one photovoltaic substrate on the adhesive layer.

5. The method according to claim 4, further comprising performing an annealing step before positioning the at least one photovoltaic substrate on the adhesive layer.

6. The method according to claim 5, wherein performing the annealing step comprises heating to a temperature in the range between 100° C. and 150° C. for 5 to 15 minutes.

7. The method according to claim 1, further comprising performing an outgassing step after bonding the at least one crystalline silicon photovoltaic substrate to the carrier.

8. The method according to claim 7, wherein performing the outgassing step comprises heating to a temperature in the range between 150° C. and 200° C. for 15 to 60 minutes.

9. The method according to claim 1, wherein removing a surface portion of the at least one photovoltaic substrate comprises chemically etching a 1 micrometer to 5 micrometer thick surface portion at the rear side of the at least one photovoltaic substrate.

10. The method according to claim 1, wherein removing a surface portion of the at least one photovoltaic substrate comprises etching in a solution of TMAH in water.

11. The method according to claim 10, wherein etching comprises etching in a solution containing 1% to 5% TMAH at a temperature in the range between 20° C. and 50° C.

12. The method according to claim 1, further comprising depositing an intrinsic a-Si:H passivation layer on the at least one photovoltaic substrate.

13. The method according to claim 1, wherein bonding the at least one crystalline silicon photovoltaic substrate to the carrier comprises bonding a plurality of crystalline silicon photovoltaic substrates to the carrier.

14. The method according to claim 1, wherein the carrier and the adhesive layer are optically transparent in a wavelength range of the solar spectrum within an absorption spectrum of the photovoltaic substrate.

15. The method according to claim 1, wherein the adhesive layer is a silicone adhesive layer.

\* \* \* \* \*